United States Patent
Ou-Yang

(10) Patent No.: US 8,062,705 B2
(45) Date of Patent: Nov. 22, 2011

(54) METHOD AND APPARATUS FOR CONTROL OF LAYER THICKNESSES

(75) Inventor: Chieh Ou-Yang, Los Angeles, CA (US)

(73) Assignee: Singulus Technologies AG, Kahl Am Main (DE)

( * ) Notice: Subject to any disclaimer, the term of this patent is extended or adjusted under 35 U.S.C. 154(b) by 1559 days.

(21) Appl. No.: 10/725,795

(22) Filed: Dec. 2, 2003

(65) Prior Publication Data

US 2004/0137751 A1 Jul. 15, 2004

Related U.S. Application Data

(60) Provisional application No. 60/431,346, filed on Dec. 5, 2002.

(51) Int. Cl.
*B05D 3/04* (2006.01)
*B05D 3/06* (2006.01)
*B05D 3/12* (2006.01)

(52) U.S. Cl. ........ 427/240; 427/542; 427/557; 427/377; 427/398.4; 427/425; 118/642; 118/52; 118/58; 118/69; 118/320

(58) Field of Classification Search .................. 427/240, 427/425, 377, 378, 398.1, 398.4, 398.5, 372.2, 427/542, 557, 348; 118/52, 320, 642, 58, 118/69
See application file for complete search history.

(56) References Cited

U.S. PATENT DOCUMENTS

| | | | |
|---|---|---|---|
| 5,487,127 A | 1/1996 | Gronet et al. | 392/416 |
| 5,580,607 A * | 12/1996 | Takekuma et al. | 427/240 |
| 5,932,009 A * | 8/1999 | Kim et al. | 118/52 |
| 6,174,651 B1 | 1/2001 | Thakur | 430/327 |
| 6,238,735 B1 * | 5/2001 | Mandal et al. | 427/240 |
| 6,254,936 B1 * | 7/2001 | Gurer et al. | 427/377 |
| 6,322,626 B1 * | 11/2001 | Shirley | 118/73 |
| 2002/0011478 A1 | 1/2002 | Ratliff | 219/390 |

FOREIGN PATENT DOCUMENTS

| | | |
|---|---|---|
| EP | 0 840 357 A | 5/1998 |
| WO | 99/16019 A | 4/1999 |

\* cited by examiner

*Primary Examiner* — Kirsten Jolley
(74) *Attorney, Agent, or Firm* — Pearne & Gordon LLP

(57) ABSTRACT

It is shown a method and apparatus for distributing a viscous liquid over a surface of a substrate, e.g. a semiconductor wafer or a datastorage media, by conditioning the substrate thermally, locally specific before or during the spin coating process.

9 Claims, 3 Drawing Sheets

METHOD AND APPARATUS FOR CONTROL OF LAYER THICKNESSES

CROSS REFERENCE TO RELATED APPLICATON

This application claims priority of U.S. Appl. No. 60/431,346, which is incorporated herein by reference.

FIELD OF THE INVENTION

This invention generally relates to the field of spin coating of substrates, especially to a method and apparatus for controlling the thickness distribution of the coating by controlling the temperature distribution of the coating on the substrate.

BACKGROUND OF THE INVENTION

As is well known in the prior art, especially in the field of semiconductor manufacturing but also in certain areas of optics or biotechnology, a homogenous distribution of liquids on an essentially plane substrate may be achieved by rotating (spinning) a substrate around an axis normal to the plane given by its surface. By applying a viscous liquid onto the surface during spinning centrifugal forces affect a distribution of the liquid radially outwards over the surface. Such "spinning" technique is used to disperse e.g. lacquer, resins, photo resist on semiconductor substrates. Moreover it is utilized in the production of optical data storage technology to provide an essentially homogeneous layer of resin, lacquer, adhesive etc. A special case is the production of all type of DVD formats which require the bonding of two half-disks.

A standard process for such distribution method is:
1) Dispensing a liquid on the substrate to be coated; eventually rotating it slowly during this step to achieve a advantageous initial spreading.
2) Spinning the disk at high speed (typically a few hundred rpm up to 12.000 rpm) to homogeneously distribute the liquid. The thickness of the layer depends on parameters such as viscosity, temperature, rotation speed and rotation time.

For substrates with a center hole the profile of the spin coated layer thickness shows a low-high trend from the inner radius towards the outer edge. This is due to the fact that there is no liquid material at/close to the center hole which could flow outwards. This lack of material causes the reduced thickness at small radii.

The variation of the thickness distribution therefore will not be reduced to a minimized level by standard spin coating process. In order to achieve an optimized coating condition, an extra treatment during the spin coating process is required.

Moreover, for substrates without a center hole it is difficult to achieve ramped thickness distributions, as would be of interest e.g. for photo resist coating thickness in mastering applications.

It is therefore desirable to have a method to influence the radial thickness distribution during the spinning process. The radial thickness dependence of a liquids thickness is dictated by the physics of the spinning process and cannot be avoided with radially constant viscosity of the liquid. The objective of the invention therefore is to provide a method for controlling the viscosity of the liquid to be distributed during spinning.

DESCRIPTION OF PRIOR ART

In semiconductor manufacturing the use of cooling or heating chucks is widely known. Onto these chucks the semiconductor substrates, normally a wafer, are clamped and by thermal contact with the (heated or cooled) chuck the substrates temperature is adjusted according to the needs of the particular processing step. However, such chucks seek to adjust temperatures homogenously over the complete area of the substrate.

A use and continuation of that principle is being shown in U.S. Pat. No. 6,242,044 B1. This document describes a method to adjust the temperature of a CD radially from the center to the edge. This is achieved in an embodiment with a central rotating shaft with a thereon mounted plate for carrying the CD.

The bottom of the shaft only is being actively cooled and via thermal conductivity a thermal gradient over the plate is being formed. The drawbacks of this method are as follows: The temperature gradient is being dependant on the material of the chuck and the environmental conditions such as ambient temperature. Moreover the system will need time to achieve a stable condition, i.e. the thermal gradient must develop. Furthermore polycarbonate is a relatively good thermal insulator, therefore cooling and/or heating a liquid dispensed on the surface via the plastic substrate is inefficient.

SUMMARY OF THE INVENTION

To influence the liquids viscosity in a spin coating process, especially the resin layer thickness distribution of spin-coated substrates with a center hole (e.g. optical disks like DVD, CD, Blu-Ray . . . etc.), a temperature gradient is created locally selectively before or during a spinning process by a heat source directed to the side of the substrate where the liquid is distributed on. Alternatively a cooling source can be used to achieve such a temperature gradient.

DETAILED DESCRIPTION OF PREFERRED EMBODIMENTS

One embodiment of the invention comprises a stream of hot (temperature range 40-90° C.) gas directed on the outer radius of the disk during spinning, in order to change the liquids viscosity over the radius of the disk.

In another embodiment, the stream of hot gas is directed via suitable means onto several areas of the substrate. Another embodiment allows to control temperature and/or flow of gas selectively to precisely control the liquids viscosity and thereby thickness distribution of the liquid on the spin coated substrate. "Gas" is to be understood in the broadest manner, such as simple air or cleaned gases provided from gas reservoirs. Heating of the gas may be achieved electrically via a resistance heating or other technical suitable means.

This thermal conditioning may in another embodiment of the invention be achieved by sources of electromagnetic radiation. This may comprise lamps with essential visible spectra or IR spectra.

In a further emodiment the inventions thermal source may comprise several sub sources, which can advantageously be directed to different locations of the substrate during spinning. This results in a control of thermal conditions in an essential circular region around the axis of rotation. Technically this may be achieved by e.g. a plurality of nozzles, directing heated or cooled gases to such regions of the substrate. Another variety is to use a plurality of lamps, such as IR radiators or halogen lamps, being arranged to aim at different locations of the substrate.

In case of gas nozzles, thermal conditioning of the substrate can easily be adjusted by regulating gas flow and/or temperature of the gas. In case of lamps this can be accomplished by regulating the power distributed to the respective lamp. For both cases the angle of the nozzle or lamp with respect to the plane of the substrate is a further parameter to finetune the thermal conditioning.

An apparatus suitable to implement the invention may comprise a rotatable support, dispensing means to spread a liquid on the surface of the substrate and means to fasten at least one thermal source in a position with respect to the substrate, where it can influence the thermal condition of the substrate. In one embodiment this fastening means may comprise a cover with the thermal source and, eventually, dispensing means affixed to it.

In a preferred embodiment the thermal sources are attached to an arm, which extends over at least a portion of the rotatable support. This arm, cover or in general fastening means may be movable in a way to clear the area of the substrate/support in order to load and unload the substrate from and to the support.

DETAILED DESCRIPTION OF THE DRAWINGS

Figure 1:
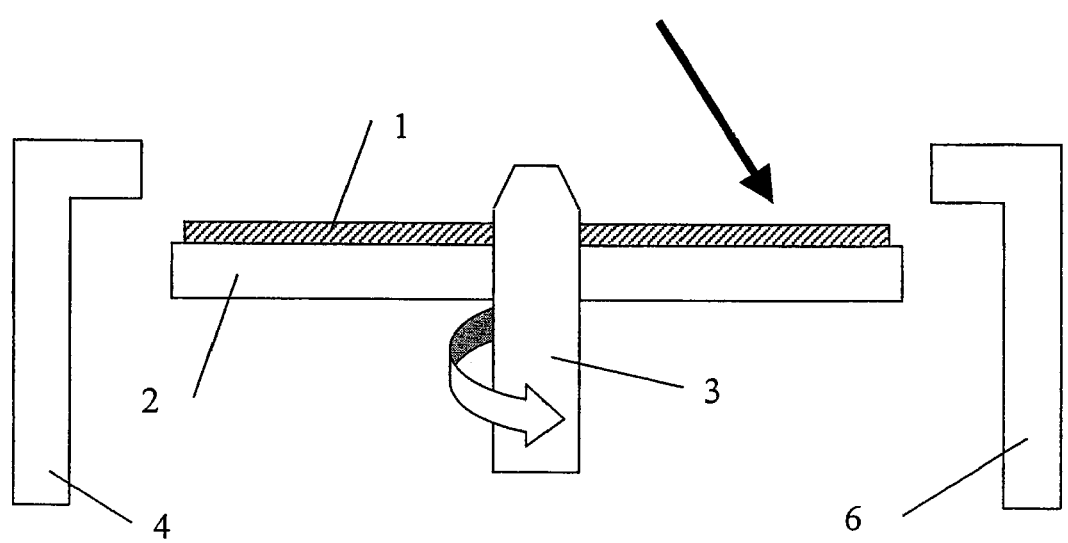
FIG. 1 is a cross sectional view of a rotational support with a substrate.

FIG. 1 shows a substrate 1 on a support 2. The substrate has a center hole which allows to centering it around a rotation axis 3. The arrow indicates the rotation of support and substrate. Driving means for rotation are not shown. During rotation excess liquid is being spinned outwards, shields 4 and 6 protect the environment from such excess liquid.

Figure 2:
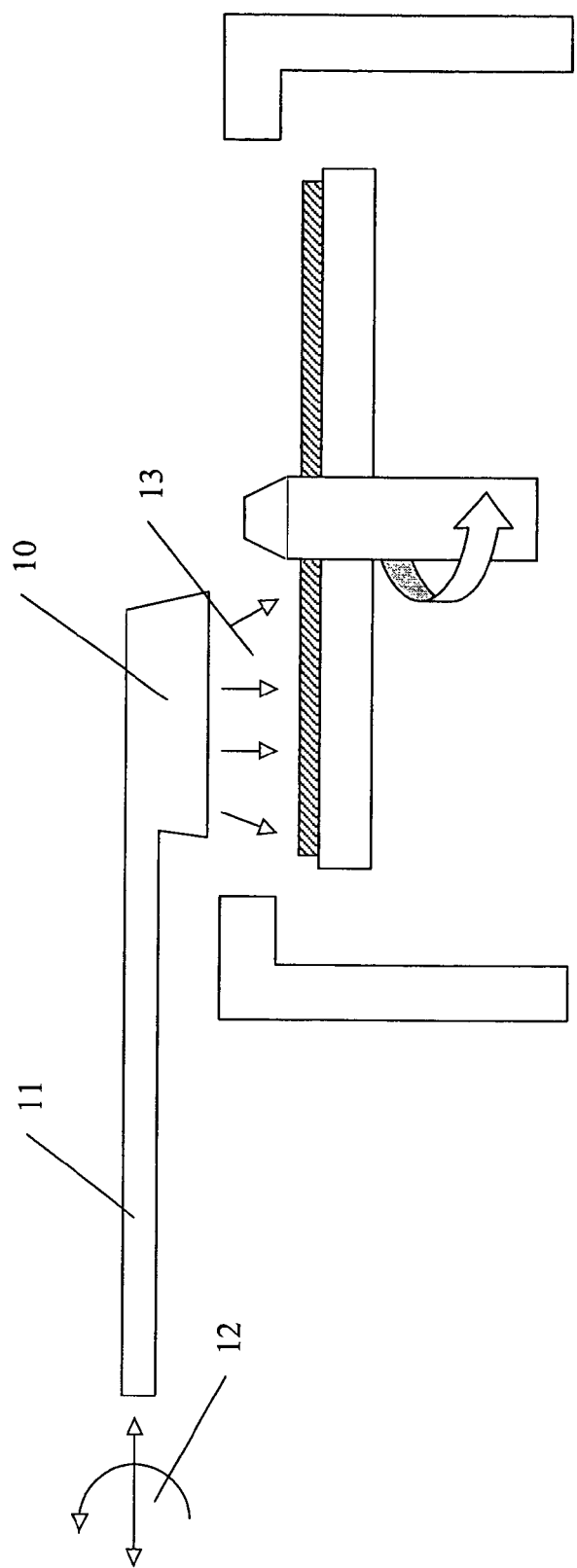
FIG. 2 shows an embodiment of the invention with an arm extending over the substrate with several thermal sources.

FIG. 2 shows the embodiment of FIG. 1 with a movable arm 11 with a source of radiation 10. The movability of arm 11 is indicated by arrows 12. As can easily be understood, the arm may be moved linearity, pivoted horizontally or vertically or in any other suitable manner to clear the area of substrate and support. This may be especially necessary when the substrate is being loaded or unloaded from the support. Loading and unloading mechanisms are not shown, they can be construed according to the state of the art.

Arrows 13 indicate the effective direction of a plurality of thermal sub sources.

In an application of the inventive method in an apparatus according to the invention, substrate 1 is being placed by suitable means on support 2. Substrate 1 may be a semiconductor wafer, a datastorage media such as a CD, DVD or alike or any essentially flat workpiece. In a preferred embodiment arm 11 carries as well thermal sources as dispensing means, so after placing the arm above the substrate liquid could be dispensed. This way the liquid is being spread upon the surface of substrate 1, eventually while being rotated slowly. After spreading the liquid the spinning of the substrate is initiated and in parallel to or shortly after start of spinning the thermal conditioning begins. The conditioning time can be defined by precedent experiments, or alternatively contact free measurement means determine the end of the thermal conditioning.

Furtheron edge effects, like the build up of droplets at the edge of spin coated substrates can be avoided by selectively directing a thermal source at such edge.

Basically the thermal source(s) locally influence the viscosity of the liquid, such that a desired distribution, homogenous or a selectively inhomogenous, on the surface of the substrate is being achieved.

In another way of using the invention the order of steps may be changed, in a way, that the substrate is being preheated in the way described, the liquid being dispensed and spinned afterwards. This may be advantageous for applications, where e.g. mechanical, physical or chemical constraints do not allow the order described beforehand. In this case the thermal capacity of the substrate must be sufficient to hold the thermal gradient until the liquids visosity can be influenced.

The inventive method may be performed at a single process station, where the thermal source, dispensing means and rotatable means are being joined. However it may be beneficial to distribute the steps of thermal conditioning, dispensing and spinning to several process modules.

Figure 3:
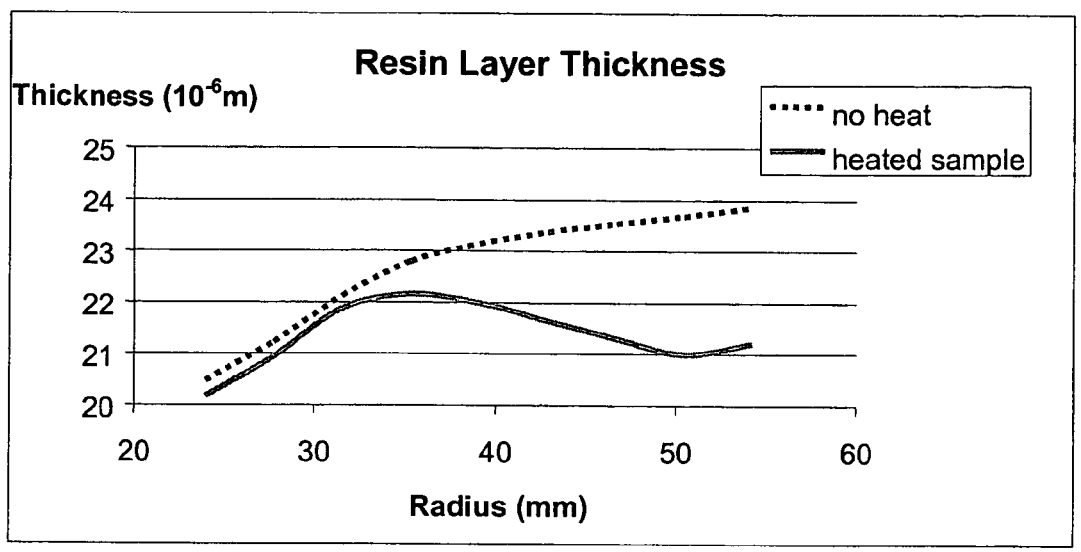
FIG. 3 shows the result of an experiment according to the invention

FIG. 3 shows results of a single heat source (flow of heated air) being directed to an outer region of an optical storage media during spin coating with resin. Comparison to an unconditioned sample shows significant improvement of layer homogeneity. In contrast to not heated substrates with monotone increasing thickness as a function of the radius, the thickness of the partially heated substrates decreases after reaching a maximum at a radius of about 35-45 mm.

The thermal gradient applied between different areas of a substrate was just a few degrees, in case of a bonding lacquer on a DVD half disk about 4° C. Depending on viscosity and other environmental conditions a thermal gradient of about 10° C. is sufficient for most applications.

What is claimed is:

1. A method for distributing a viscous liquid over a surface of a substrate, comprising the steps:
    placing a substrate essentially horizontal on a support,
    applying a viscous liquid onto a surface of said substrate,
    rotating the substrate to distribute the liquid radially outwards, and
    conditioning the liquid on the substrate thermally, to influence its viscosity locally by creating a locally selective temperature gradient;
    said thermal conditioning being effected by a thermal source of heat or cold placed above the surface of the substrate;
    said thermal source comprising a stream of heated or cooled gas, or a source of electromagnetic radiation.

2. A method according to claim 1, wherein the source of radiation is a lamp with essentially visible spectra or an IR radiator.

3. A method according to claim 1, wherein the thermal source comprises at least two sub sources.

4. A method according to claim 3, wherein the sub-sources are directed to different positions with regard to the radius on the substrate.

5. A method according to claim 1, wherein said substrate is supported on a rotatable support, with dispensing means for said liquid provided above the substrate surface and fastening means for at least one thermal source placed above the substrate.

6. A method according to claim 5, wherein the fastening means comprise a cover, extending over at least a part of the support.

7. A method according to claim 5, wherein the fastening means comprise an arm extending over at least a portion of the support.

8. A method according to claim 5, wherein the dispensing means are mechanically affixed to the fastening means.

9. A method according to claim 7, wherein the fastening means are movable with respect to substrate and support in order to remove the arm at least during loading and unloading of the substrate.

* * * * *